United States Patent [19]
Farnworth et al.

[11] Patent Number: 5,767,443
[45] Date of Patent: Jun. 16, 1998

[54] MULTI-DIE ENCAPSULATION DEVICE

[75] Inventors: Warren M. Farnworth, Nampa; Alan G. Wood; Tim J. Corbett, both of Boise, all of Id.

[73] Assignee: Micron Technology, Inc., Boise, Id.

[21] Appl. No.: 353,769

[22] Filed: Dec. 12, 1994

Related U.S. Application Data

[63] Continuation-in-part of Ser. No. 91,786, Jul. 10, 1993, abandoned.

[51] Int. Cl.⁶ .................................................. H01R 9/09
[52] U.S. Cl. ........................................... 174/50; 439/69
[58] Field of Search ..................... 174/50, 52.1; 361/728, 361/729, 730, 736, 737, 752, 784, 790, 796, 797; 439/65, 66, 69, 71

[56] References Cited

U.S. PATENT DOCUMENTS

| | | | |
|---|---|---|---|
| 3,500,131 | 3/1970 | Seeley et al. | 361/796 |
| 3,648,113 | 3/1972 | Rathjen et al. | 317/100 |
| 3,760,486 | 9/1973 | Rifkin et al. | 29/278 |
| 3,812,402 | 5/1974 | Garth | 317/100 |
| 3,829,817 | 8/1974 | Beavitt | 339/17 F |
| 4,328,530 | 5/1982 | Bajorek et al. | 361/308 |
| 4,502,100 | 2/1985 | Greenspan et al. | 361/384 |
| 4,645,279 | 2/1987 | Grabbe et al. | 339/17 |
| 4,873,615 | 10/1989 | Grabbe | 361/395 |
| 4,923,404 | 5/1990 | Redmond et al. | 439/71 |
| 4,927,369 | 5/1990 | Grabbe et al. | 439/66 |
| 4,933,808 | 6/1990 | Hoton et al. | 361/715 |
| 5,015,191 | 5/1991 | Grabbe et al. | 439/71 |
| 5,104,324 | 4/1992 | Grabbe | 439/62 |
| 5,142,449 | 8/1992 | Littlebury et al. | 361/782 |
| 5,243,757 | 9/1993 | Grabbe et al. | 29/882 |
| 5,528,466 | 6/1996 | Lim et al. | 361/820 |

OTHER PUBLICATIONS

AMP Product Specification PIB 65559 Issued Jan. 1993 AMP Inc. Harrisburg, PA 17105.

Primary Examiner—Bot L. Ledynh
Assistant Examiner—Dean A. Reichard
Attorney, Agent, or Firm—Schwegman, Lundberg, Woessner & Kluth, P.A.

[57] ABSTRACT

Disclosed is an encapsulation device for bare die. The encapsulation device includes chambers having parallel walls, an insertion void, and a spring retention electrical contact having a compliant foot and comprises a cap having a compression pad. The encapsulation device of the invention provides a reliable contact between the die and a mounting board via the compliant foot. The insertion void allows for a safe insertion of a die into a chamber of the encapsulation device. The compression pad and the spring retention electrical contact provide positive retainment of the bare die within the encapsulation device.

26 Claims, 4 Drawing Sheets

MULTI-DIE ENCAPSULATION DEVICE

This Application is a continuation-in-part of the Application having Ser. No. 08/091,786 filed on Jul. 10, 1993 and entitled A Multi-Die Encapsulation Device and Method and having inventors Warren M. Farnworth, Alan G. Wood, and Tim J. Corbett, now abandoned.

FIELD OF THE INVENTION

The present invention relates to packaging of semiconductor integrated circuits, and more particularly to a multi-die encapsulation device.

BACKGROUND OF THE INVENTION

AMP Corporation located in Harrisburg, Pa. has developed an encapsulation device for retaining a plurality of bare semiconductor die. A cross sectional view of a simplified AMP encapsulation device is shown in FIG. 1. The AMP encapsulation device is typically molded plastic and has a chamber portion comprised of a plurality of die chambers 5 and is enclosed with a cap after the insertion of the die into the chambers 5. Each chamber has at least one beveled edge 10. A bare die is inserted by hand into a chamber 5 with the circuit side touching the beveled edge 10. The beveled edge 10 thus serves as a guide for the insertion of the bare die. However, since the circuit slides across the bevel the circuitry may be damaged during insertion. The bare die is inserted into a spring retaining and contact assembly 15. The retaining and contact assembly 15 holds the bare die in position in the encapsulation device. A spring portion 20 electrically contacts the bare die and a rigid foot portion 25 is provided for contacting a circuit board onto which the encapsulation device is mounted. Due to the rigidity of the foot portion 25 and inherent bowing of many circuit boards the failure rate of electrical contact between the bare die and the board is typically high. At times the failure runs as high as 80%. In addition to these problems solid caps secured over the chamber portion of the encapsulation device do not retain the die in the correct position and often are a cause of die damage subsequent to encapsulation of the die.

Thus a need exists for an encapsulation device for bare die which provides reliable electrical contact between the die and a mounting board and a need exists for a method for safely inserting the bare die into the encapsulation device. In addition there is a need to provide position retainment of the bare die within the encapsulation device without fear of die damage following encapsulation

SUMMARY OF THE INVENTION

The invention is an encapsulation device or electrical housing assembly for bare die or first circuit elements. The encapsulation device is typically molded and comprises chambers or receiving members having parallel walls, an insertion void, a spring retention electrical contact a resilient contact, a compliant foot or resilient foot portion, and a cap having a compression pad. The encapsulation device of the invention provides a reliable contact between the first circuit element and a mounting board or second circuit element via the compliant foot and spring retention electrical contact. The insertion void allows for a safe insertion of a die into a chamber of the encapsulation device. The compression pad and the spring retention electrical contact provide positive retainment of the bare die within the encapsulation device. The resilient foot portion and the spring retention portion are movable from a first and a second axis, respectively, wherein the first axis and the second axis are generally perpendicular to one another.

The invention is a process for inserting bare die into the encapsulation device of the invention and is a vacuum insertion tool used in the insertion of the bare die into the encapsulation device.

DETAILED DESCRIPTION OF THE INVENTION

Figure 2:
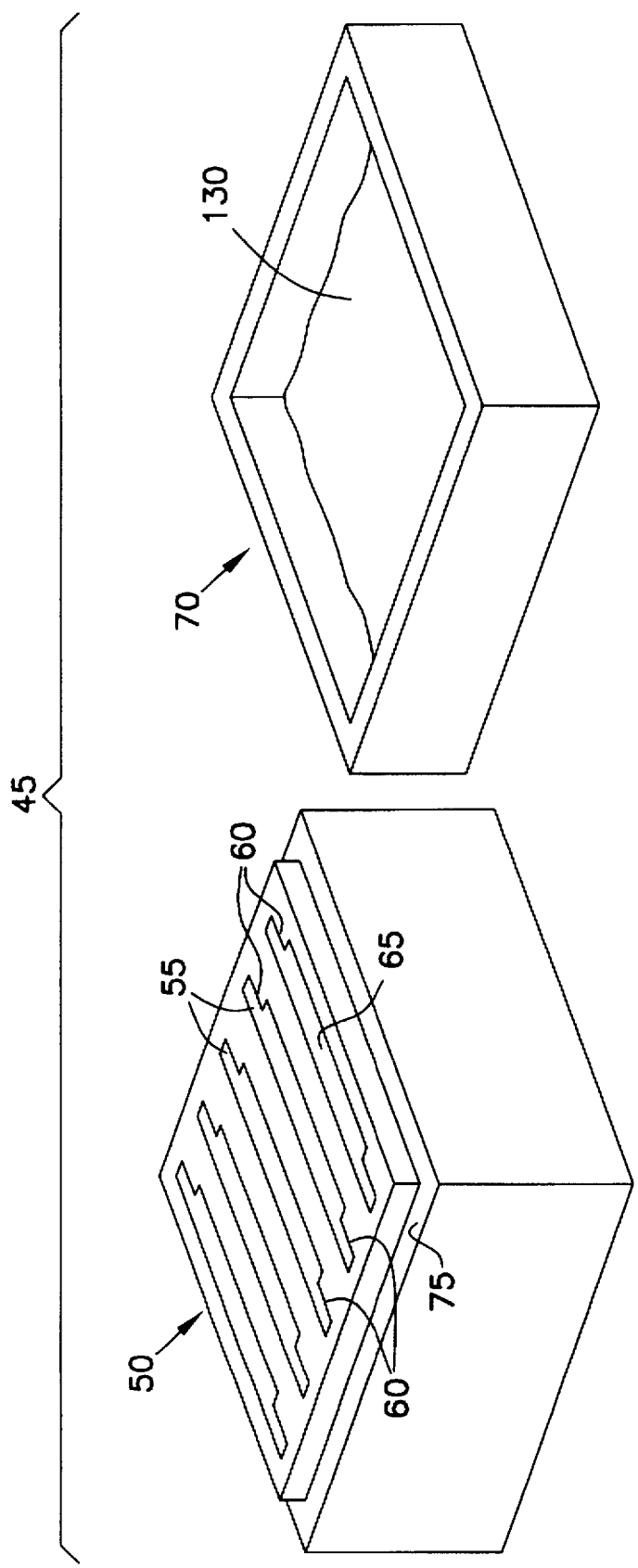
FIG. 2 is three dimensional view of the encapsulation device of the invention prior to insertion of bare die and prior to final assembly.

FIG. 2 is a three dimensional view of the encapsulation device 45 of the invention prior to insertion of bare die into the encapsulation device. A chamber portion 50 comprises a plurality of chambers 55 for accepting and retaining the bare die. The exact number of chambers 55 may vary depending on design considerations. Each chamber 55 comprises retaining edges 60 which define a chamber void 65. The chamber void 65 accepts a bare die insertion tool during the process of inserting the bare die into each chamber 55.

When the bare die have been inserted into the chambers 55 a cap 70 is sealed to the chamber portion. The cap 70 rests on lip 75 of the chamber portion 50. The final locking seal between the cap 70 and the lip 75 is typically an epoxy which when heated allows the cap to be removed and resealed, thereby allowing for the removal and the replacement of faulty die. However, other locking seals such as a snap seal, a grooved seal, and a pressure seal, may work equally well. The chamber portion 50 and the cap 70 are typically molded plastic.

Figure 3:
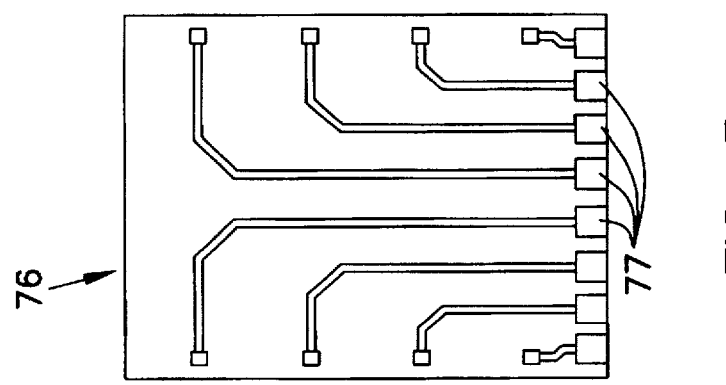
FIG. 3 is simplified schematic of a bare die and the die pads thereon.

FIG. 3 is representative of a single bare die 76 designed to fit into the encapsulation device 45. In this case the single die 76 has eight die pads 77 although it is possible for the bare die to have any number of die pads.

Figure 4:
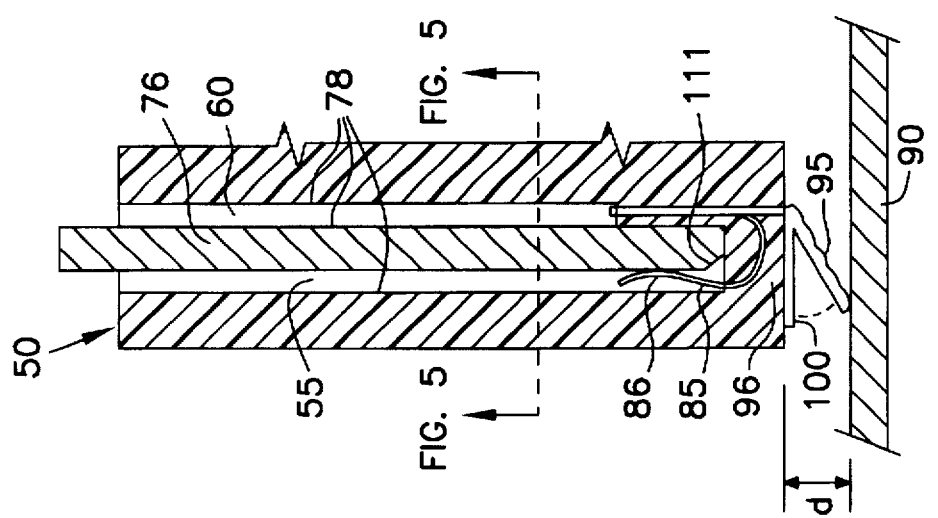
FIG. 4 is a cross sectional view of one chamber of the encapsulation device of the invention with a bare die inserted and seated therein.

FIG. 4 is a cross sectional view of a single die chamber 55 having parallel walls 78. A bare die 76 inserted into the die chamber 55 is retained against the retaining edges 60 by retaining contact 85. The retaining contact 85 and electrical contacts one of the die pad 77 of bare die 76, see FIG. 3, at a spring portion 86 and electrically contacts a circuit board 90 with a compliant foot portion 95 when seated in the die chamber 55. Thus the retaining contact protrudes through a bottom portion 96 of the chamber portion 50. The compliant contact foot 95 provides reliable contact to the circuit board 90 even though the circuit board 90 may be bowed. It can be seen from FIG. 3 that the compliant foot 95 has a vertical displacement d. Therefore as long as the distance between the reference foot 100 and the circuit board 90 is less than d and the distance accommodates a width of the compliant foot 95 the compliant foot 95 makes contact with the circuit board 90. The number of retaining contact 85 is equal to the number of die pads 77 on the bare die 76. Therefore for the bare die of FIG. 2 there would be eight retaining contact 85 in a die chamber 55.

Figure 1:
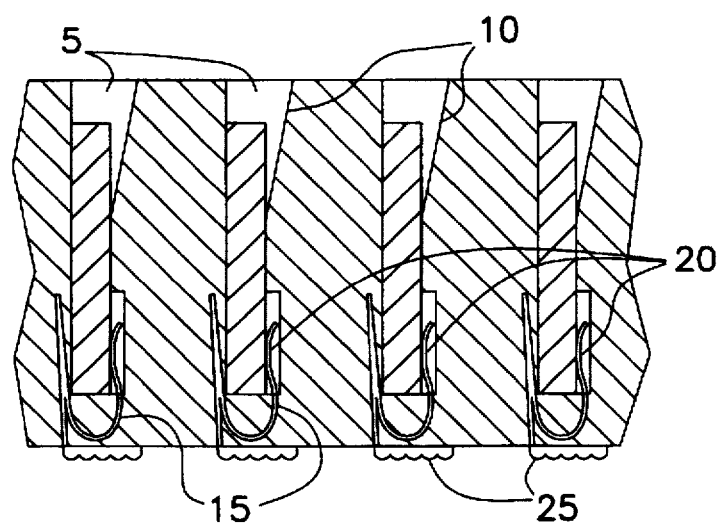
FIG. 1 is a simplified AMP encapsulation device of the prior art.
Figure 5:
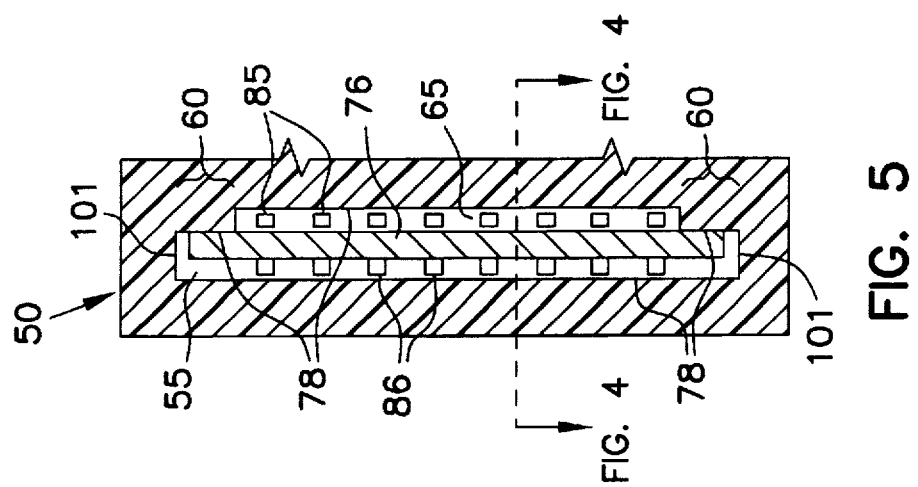
FIG. 5 is a top view of one chamber of the encapsulation device of the invention with a bare die inserted therein.

FIG. 5 is a top view of a single die chamber 55. In addition to elements previously named a pair of opposed parallel walls 101 is shown in FIG. 5. Preferably, the chamber portion 50 shown in FIG. 1 is oriented, during bare die insertion, such that the chambers 55 are stacked. This orientation allows for a simplified insertion process which can best be understood with reference to FIGS. 3, 4, 5, 6, and 7.

Figure 6:
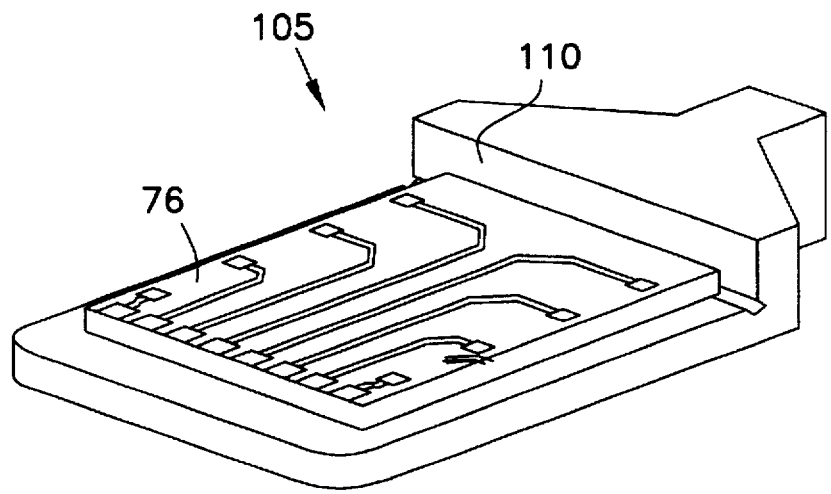
FIG. 6 is a three dimensional view of a bare die insertion tool of the invention.
Figure 7:
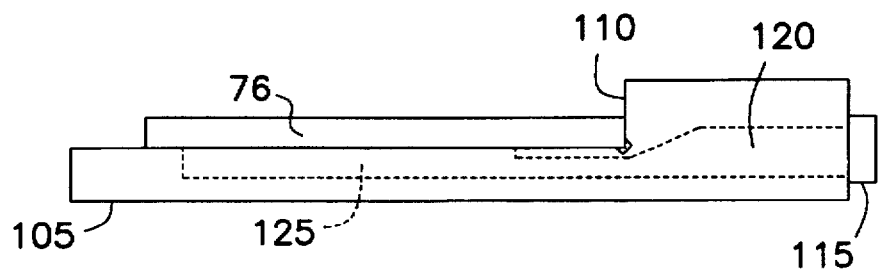
FIG. 7 is a side view of the three dimensional view of the bare die insertion tool of FIG. 6.

A bare die 76 is placed on an insertion tool 105, shown three dimensionally in FIG. 6 and cross sectionally in FIG. 7, with the circuit side of the bare die 76 up, thereby preventing damage to the circuitry of the bare die 76. The insertion tool 105 is then inserted into the chamber void 65 between the two retaining edges 60. The guide edge 110 of the insertion tool 105 is used to mechanically force the bare die 76 into the retaining contact 85, see FIG. 4. For best results a bare die 76 with a beveled edge 111 is used to eliminate breakage as the bare die 76 is forced into the retaining contact 85, again see FIG. 4. The bare die 76 is held in a correct orientation on the insertion tool 105 with a vacuum provided by a vacuum source, not shown. The vacuum source is connected to the insertion tool 105 at vacuum connection 115 through a means such as a plastic hose, not shown.

Internal passages 120 connected to the vacuum connection 115 directs the vacuum to suction depressions 125. Thus the die insertion tool 105 allows for insertion of the bare die 76 into chamber 55 without damage to die circuitry. Not only does the process and encapsulation device of the invention prevent damage to die circuitry there is also a space savings over the beveled wall chamber of the related art shown in FIG. 1.

However it should also be noted that the exact orientation of the parallel chamber walls is unimportant. For example they may be at an angle of less than 90 degrees to the circuit board to which the encapsulated device attaches. In this case the chambers may be slanted to form a low profile encapsulation device.

After the bare die 76 have been inserted into the desired chambers 55 the cap 70 is seated on lip 75, see FIG. 2, and retained and sealed to the chamber portion 50 with a sealant glue. The cap contains a compression pad 130 which provides a flexible bias to the bare die 76. Various substances may be used for the compression pad including a variety of springs, gels, or foams. Because of the flexible bias the compression pad 130 biases the bare die firmly into the retaining contact. Therefore the compression pad 130 of the cap 70 helps to eliminate breakage of the bare die even with jarring. The seating of the cap 70 on the lip 75 completes the encapsulation process.

Although the invention has been described with respect to specific embodiments the invention is limited only as claimed.

What is claimed is:

1. An encapsulation device, comprising:
 a) a chamber portion, comprising
  i) a plurality of parallel walls; and
  ii) a pair of opposing walls, planes in which said opposing walls lie being perpendicular to planes in which said plurality of parallel walls lies, wherein said plurality of parallel walls and said pair of opposing walls form a plurality of parallel die chambers, each of the die chambers of the plurality for accepting one semiconductor die of a plurality of semiconductor die, each of said die chambers comprises a retaining edge, an insertion void, and a contact portion, wherein one of the semiconductor die of the plurality of semiconductor die is correctly inserted into one of the die chambers when seated in the contact portion and when portions of a non circuit side of the semiconductor die are biased against said retaining edges, said insertion void formed between the retaining edges and one of the plurality of parallel walls facing the non circuit side of the semiconductor die; and
 b) a cap portion for mating with a top portion of the chamber portion, wherein said cap portion comprises a compression pad positioned adjacent to openings of said plurality of die chambers when said cap portion is mated with said chamber portion.

2. The encapsulation device as specified in claim 1, wherein said contact portion comprises a biasing means for mechanically biasing the semiconductor die against the retaining edges.

3. The encapsulation device as specified in claim 2, wherein the biasing means is a contact retention spring.

4. The encapsulation device as specified in claim 1, wherein the contact portion further comprises a compliant foot for providing a flexible electrical connection to a circuit board external to the encapsulation device, said contact portion providing electrical communication between said semiconductor die and the circuit board.

5. The encapsulation device as specified in claim 4, wherein the compliant foot is movable through a range of degrees from a reference foot of the contact portion in order to provide electrical contact to the circuit board when a surface of the circuit board at a point of contact with the compliant foot is at a distance from the reference foot equal to or less than a distance from the reference foot to the compliant foot measured along a perpendicular to the reference foot when the compliant foot is a maximum distance possible from the reference foot.

6. The encapsulation device as specified in claim 1, wherein each of said die chambers comprises a plurality of the contact retention spring such that there is one said contact retention spring for each one of the die pad on the semiconductor die to be inserted into a corresponding one of the die chambers.

7. A connector for electrically interconnecting bare semiconductor die to a substrate, comprising:
 a housing having parallel channels for receiving the semiconductor die; and
 a contact element comprising:
  a spring portion disposed in each of said channels for electrically engaging the semiconductor die,
  a resilient portion in electrical communication with said spring portion and extending outwardly from said housing for electrically engaging the substrate circuit, said resilient portion being movable with respect to the housing.

8. A connector for electrically interconnecting semiconductor diet to a substrate, comprising:
 a housing having parallel channels for receiving the semiconductor die;
 a contact element having a spring portion disposed in each of said channels for electrically engaging the semiconductor die and having a compliant foot portion extending outwardly from said housing for electrically engaging the substrate, said compliant foot being movable with respect to the housing and resilient; and a cap portion for mating with a top portion of the housing, wherein said cap portion comprises a compression pad positioned adjacent to openings of said parallel channels when said cap portion is mated with said housing.

9. A module comprising:

a housing defining a plurality of chambers, each chamber configured to receive an unpackaged semiconductor die;

a plurality of unpackaged semiconductor die, each die in a respective one of said chambers of said housing; and a plurality of electrical connectors retained within said housing, each connector having a resilient portion placed and configured to electrically contact said die, and a compliant portion extending externally to said housing.

10. A semiconductor die housing assembly, comprising:

a housing defining a plurality of apertures therein, each of said apertures having a relatively narrow surface; and a plurality of contact assemblies retained in said housing proximate said narrow surface of each of said apertures, each said contact member having a first resilient portion configured to physically receive an edge of a semiconductor die positioned in one of said apertures and to electrically contact said die in said aperture, each said contact member further having a second resilient portion external to said housing, said second resilient portion including an element capable of making electrical contact with an electrical component positioned at a distance from said housing which is greater than a thickness of the second resilient portion, and each said contact member having an attachment portion secured within said housing.

11. A die housing assembly, comprising:

a housing member defining a chamber sized to receive a semiconductor die; and a plurality of electrical contacts, each contact having a first portion within said housing and a second portion outside said housing, the second portion of each said contact being moveable relative to said housing.

12. The die housing as specified in claim 11, wherein each said electrical contact is a single member.

13. The die housing as specified in claim 11, wherein said first portion of each said die is configured to physically and electrically engage a die in said chamber.

14. An electrical housing assembly configured to receive a plurality of semiconductor die, comprising:

a) a molded portion comprising a plurality of receiving members, each receiving member configured to receive at least a portion of one of said die; and b) at least one contact member of a plurality of contact members operably associated with each said receiving member, each said member retained integrally within said molded portion in non-removable relation therewith, each said contact member having a generally resilient receiving member portion configured to selectively engage and establish electrical contact with one of said die when said one of said die is received within one of said receiving members;

c) each of said contact members having a resilient foot portion having a connected end and a free end configured to resiliently and electrically contact a circuit element exterior to the electrical housing assembly.

15. The electrical housing assembly as specified in claim 14, further comprising a cover portion configured to mate with said molded portion and to cover the receiving members.

16. The electrical housing assembly as specified in claim 15, further comprising a compression pad for flexibly biasing each of said semiconductor die.

17. A connector for electrically interconnecting bare semiconductor die to a substrate, comprising:

a housing having parallel channels for receiving the semiconductor die; and a retaining contact assembly in each of the parallel channels, said retaining contact retaining the semiconductor die in its respective one of the channels; and a cap portion for mating with a top portion of the housing, wherein said cap portion comprises a compression pad positioned adjacent said parallel channels when said cap portion is mated with said housing.

18. The connector as specified in claim 17, wherein said compression pad biases the semiconductor die into said retaining contact assembly.

19. The connector as specified in claim 17, wherein said retaining contact assembly is in electrical communication with the semiconductor die when retaining the semiconductor die in the channel.

20. The connector as specified in claim 17, further comprising a conductive compliant member in electrical communication with said retaining contact assembly.

21. The connector as specified in claim 20, wherein said compliant member is movable and resilient.

22. A board assembly, comprising:

a substrate housing a plurality of electrical contact surfaces;

a module assembly coupled to said substrate, said module including, a housing defining a plurality of chambers;

a plurality of die distributed within said chambers; and a plurality of contact members, each contact member having a flat portion extending internal to said housing and in electrical contact with one said die within one of said chambers, each contact member having a complaint portion extending externally to said housing, said complaint portion including a cantilevered foot for applying a spring force to engage one of said contact surfaces on said substrate.

23. The board assembly as specified in claim 22, wherein each contact member is a unitary member.

24. The board assembly specified in claim 22, wherein each said die comprises a plurality of contact pads proximate an edge of said die.

25. The board assembly as specified in claim 22, wherein said chambers retain said die in generally on-edge orientation relative to said substrate.

26. The board assembly as specified in claim 25, wherein each die is retained generally perpendicular to said substrate.

* * * * *